(12) United States Patent
Hata et al.

(10) Patent No.: US 7,742,295 B2
(45) Date of Patent: Jun. 22, 2010

(54) COOLING DEVICE AND ELECTRONIC DEVICE

(75) Inventors: Yukihiko Hata, Hamura (JP); Kenichi Ishikawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 229 days.

(21) Appl. No.: 11/845,634

(22) Filed: Aug. 27, 2007

(65) Prior Publication Data
US 2008/0101017 A1    May 1, 2008

(30) Foreign Application Priority Data
Oct. 26, 2006   (JP) .............................. 2006-291406

(51) Int. Cl.
*H05K 7/20*     (2006.01)
*F28F 7/00*     (2006.01)
*H01L 23/34*    (2006.01)

(52) U.S. Cl. .................. 361/679.47; 361/700; 361/697; 361/679.52; 165/80.4; 165/80.5; 257/714; 174/15.2; 174/548

(58) Field of Classification Search ......... 361/695–697, 361/700, 679.47, 679.52; 165/80.4, 80.5, 165/104.33, 185; 257/714, 718, 719; 174/15.2, 174/548
See application file for complete search history.

(56) References Cited

U.S. PATENT DOCUMENTS

| | | | | |
|---|---|---|---|---|
| 6,122,169 A * | 9/2000 | Liu et al. | .................... | 361/700 |
| 6,408,934 B1 * | 6/2002 | Ishida et al. | ................ | 165/80.3 |
| 6,487,076 B1 * | 11/2002 | Wang | .......................... | 361/697 |
| 6,567,269 B2 * | 5/2003 | Homer et al. | ................ | 361/700 |
| 6,681,840 B1 * | 1/2004 | Mok | ............................ | 165/46 |
| 6,717,811 B2 * | 4/2004 | Lo et al. | ...................... | 361/698 |
| 7,460,370 B2 * | 12/2008 | Cheng et al. | ................ | 361/700 |
| 2003/0081382 A1 * | 5/2003 | Lin | ............................. | 361/697 |
| 2004/0201958 A1 * | 10/2004 | Lev | ............................. | 361/687 |
| 2005/0083658 A1 * | 4/2005 | Huang | ........................ | 361/700 |
| 2007/0121291 A1 * | 5/2007 | Wang et al. | ................. | 361/695 |
| 2007/0251675 A1 * | 11/2007 | Hwang et al. | .......... | 165/104.33 |

FOREIGN PATENT DOCUMENTS

| | | |
|---|---|---|
| JP | 11-274779 | 10/1999 |
| JP | 2002-118388 | 4/2002 |
| JP | 2005-286130 | 10/2005 |

* cited by examiner

*Primary Examiner*—Zachary M Pape
(74) *Attorney, Agent, or Firm*—Blakely, Sokoloff, Taylor & Zafman LLP

(57) ABSTRACT

According to one embodiment, a cooling device includes a heat diffusion plate, a heat receiving portion, a heat sink and a heat pipe. The heat receiving portion is provided on the heat diffusion plate and thermally connected to an object to be cooled. The heat sink is provided on the heat diffusion plate, and it releases the heat of the heat receiving portion to outside. The heat pipe has a first end portion to be connected to the heat receiving portion and a second end portion located on an opposite side to the first end portion and to be connected to the heat sink.

2 Claims, 9 Drawing Sheets

COOLING DEVICE AND ELECTRONIC DEVICE

CROSS-REFERENCE TO RELATED APPLICATIONS

This application is based upon and claims the benefit of priority from Japanese Patent Application No. 2006-291406, filed Oct. 26, 2006, the entire contents of which are incorporated herein by reference.

BACKGROUND

1. Field

One embodiment of the invention relates to a cooling device that can cool an object, and an electronic device that including the cooling device.

2. Description of the Related Art

Japanese Patent Application KOKAI Publication No. 2002-118388, for example, discloses a cooling device used to cool down circuit parts in the housing of a portable computer. The cooling device includes a base member formed on a sheet metal, a heat pipe mounted on the base member, a fin mounted on the base member, that radiates the heat of the heat pipe, a fan unit that cools down the fin, and a cover member that covers the fan unit from above. The heat pipe is thermally connected to the fin by its one end, and it is also thermally connected to the circuit parts by its mid portion. The base member and cover member together as an integral unit constitute a duct, which forms a flow path of air supplied by the fan unit. The base member has a linear groove section formed by, for example, bending carried out a plurality of times. The heat pipe is provided in the groove section. In this manner, the inner surface of the base member is flushed with the exposing surface of the heat pipe. Further, the fan unit is mounted on the upper side of the heat pipe.

In this cooling device, the heat generated from the circuit parts is propagated to the fin via the base member and heat pipe. On the other hand, the air supplied from the fan unit is guided by the base member to the fin. The heat propagated to the fin is released to the atmosphere by this air flow. With the structure in which the inner surface of the base member and the exposed surface of the heat pipe are flushed with each other, the generation of a turbulent flow can be prevented, and thus the air flow can be smoothed during this process.

In the meantime, Japanese Patent Application KOKAI Publication No. 11-274779 discloses an other example of the cooling device, which will now be described. This cooling device includes a heat pipe and two plates between which the heat pipe is interposed. The plates abut on the electronic parts so as to be able to absorb the heat generated from the electronic parts. For the other sections of the plates, a fan unit is provided to release the heat of the plates to the atmosphere by the fan unit.

However, the cooling device disclosed in Jpn. Pat. Appln. KOKAI Publication No. 2002-118388 requires the bending to be carried out onto the base member a plurality of times, which complicates the manufacturing process. Further, the heat pipe is thermally connected to the circuit parts by its mid portion, and therefore the heat transmitted from the circuit parts is propagated towards both end of the heat pipe. The portion of the heat that is propagated towards the fin is released to the atmosphere outside the housing. However, the portion directed towards the opposite end to the fin is never released to the atmosphere, and therefore it undesirably increases the temperature inside the housing. Further, the fan is mounted on an upper side of the heat pipe. With this arrangement, the thickness of the cooling device is increased, which undesirably blocks the thinning of portable computers.

The cooling device disclosed in Jpn. Pat. Appln. KOKAI Publication No. 11-274779 does not have such a structure that heat transmitted from circuit parts is propagated to the fan via a heat pipe, and therefore the heat conductivity may not be fully exhibited.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a cooling device includes a heat diffusion plate, a heat receiving portion, a heat sink and a heat pipe. The heat receiving portion is provided on the heat diffusion plate and thermally connected to an object to be cooled. The heat sink is provided on the heat diffusion plate, and it releases the heat of the heat receiving portion to outside. The heat pipe has a first end portion to be connected to the heat receiving portion and a second end portion located on an opposite side to the first end portion and to be connected to the heat sink.

Figure 1:
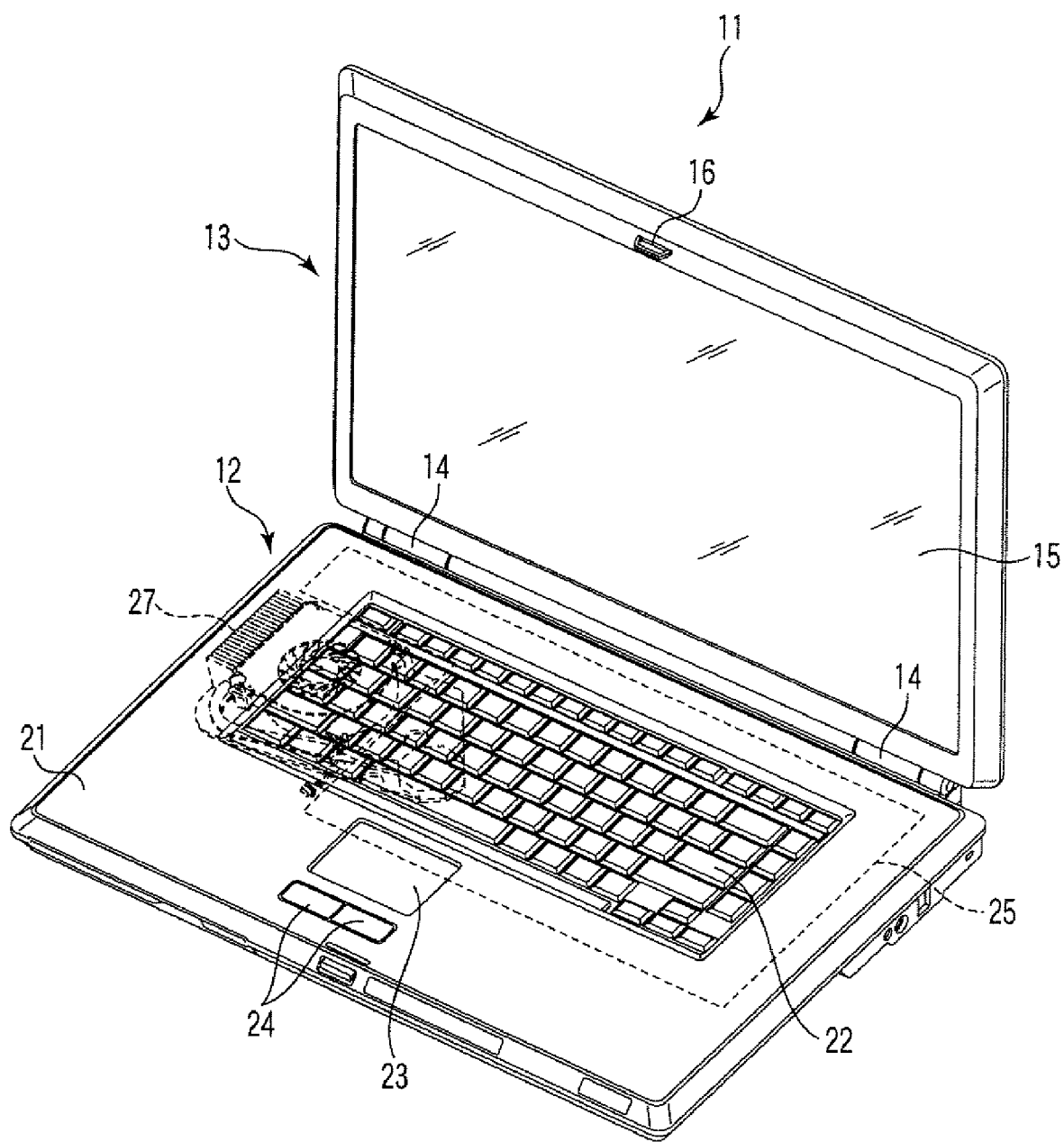
FIG. 1 is an exemplary perspective view showing a portable computer according to a first embodiment.

An electronic device according to the first embodiment in which the cooling device of the present invention is applied will now be described with reference to FIGS. 1 to 9. As shown in FIG. 1, a portable computer 11, which is an example of the electronic deices, includes a main body unit 12, a display unit 13, and a hinge member 14 provided between the main body unit 12 and the display unit 13. The hinge member 14 supports the display unit 13 such as to be pivotabie with respect to the main body unit 12. The display unit 13 includes a display 15 and a latch 16.

Figure 2:
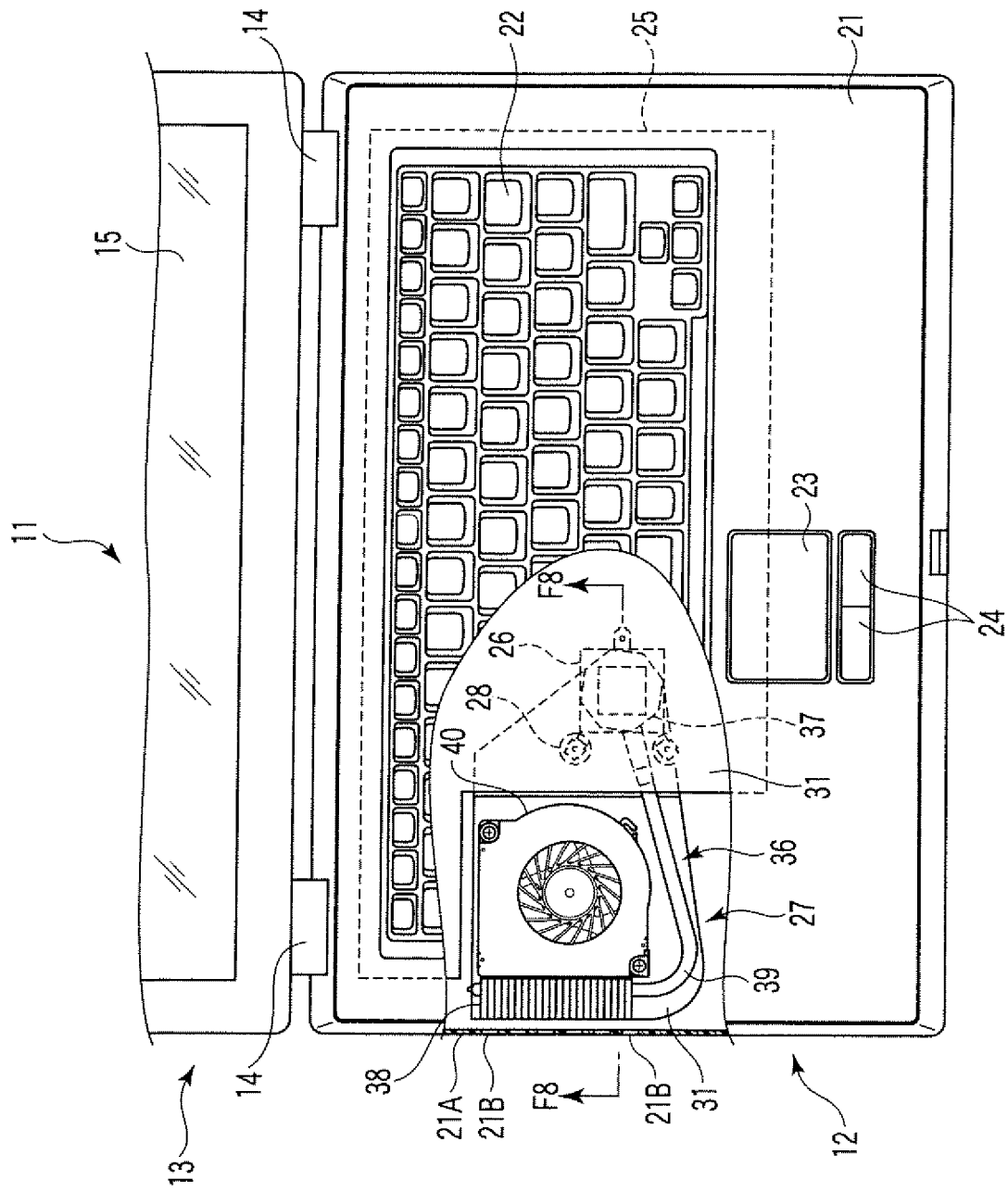
FIG. 2 is an exemplary top view showing a cooling device and a print circuit board housed in the housing of the portable computer illustrated in FIG. 1.

The main body unit 12 includes a housing 21, a keyboard 22 and a pointing device consisting of a touch pad 23 and buttons 24. As shown in FIG. 2, the main body unit 12 includes, inside the housing 21, a printed circuit board 25 on which an electronic part (circuit component) 26 is mounted, a cooling device 27 that cools the electronic parts 26, and a connection mechanism 28 that connects the printed circuit board 25 and the cooling device 27 to each other. An air outlet 21B is made in a section of a side wall 21A of the housing 21. Through the air outlet 21B, the air blow created by the fan unit 40 can be discharged to the outside of the housing 21.

Figure 3:
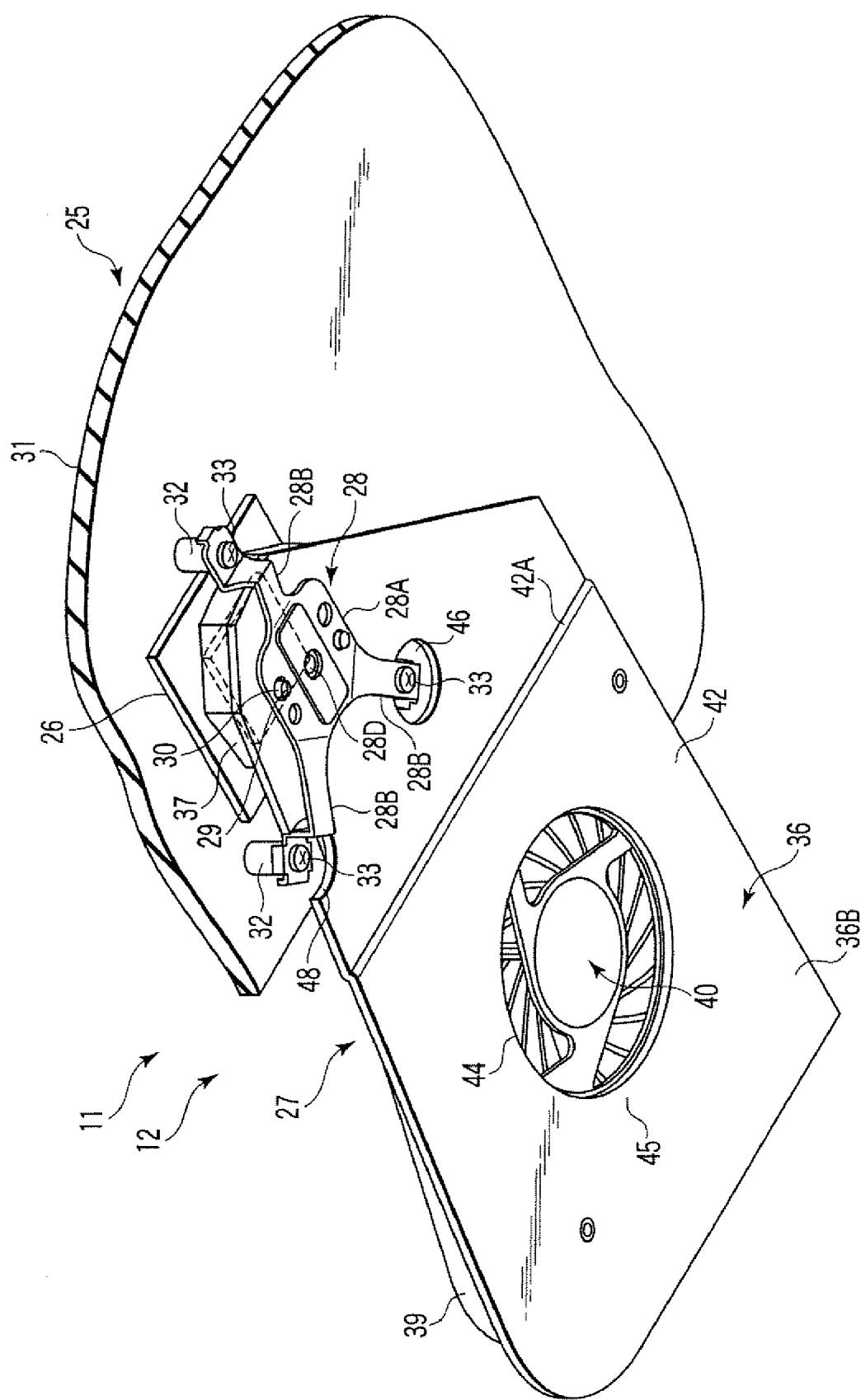
FIG. 3 is an exemplary perspective view from below showing the cooling device and the print circuit board illustrated in FIG. 2.

As shown in FIG. 3, the printed circuit board 25 includes a printed wiring board 31 in which copper-made wiring layers are stacked one another, an electronic part 26 mounted on the printed wiring board 31, and a first stud 32 that fix the connection mechanism 28 with screws. The electronic part 26 is an example of the object to be cooled by the cooling device 27, and it is, for example, a central processing unit (CPU). As a matter of course, the object to be cooled is not limited to this example, but it may be such an electronic part as a graphics chip or north bridge, or other heat generating parts including a coil used for the power circuit.

Figure 4:
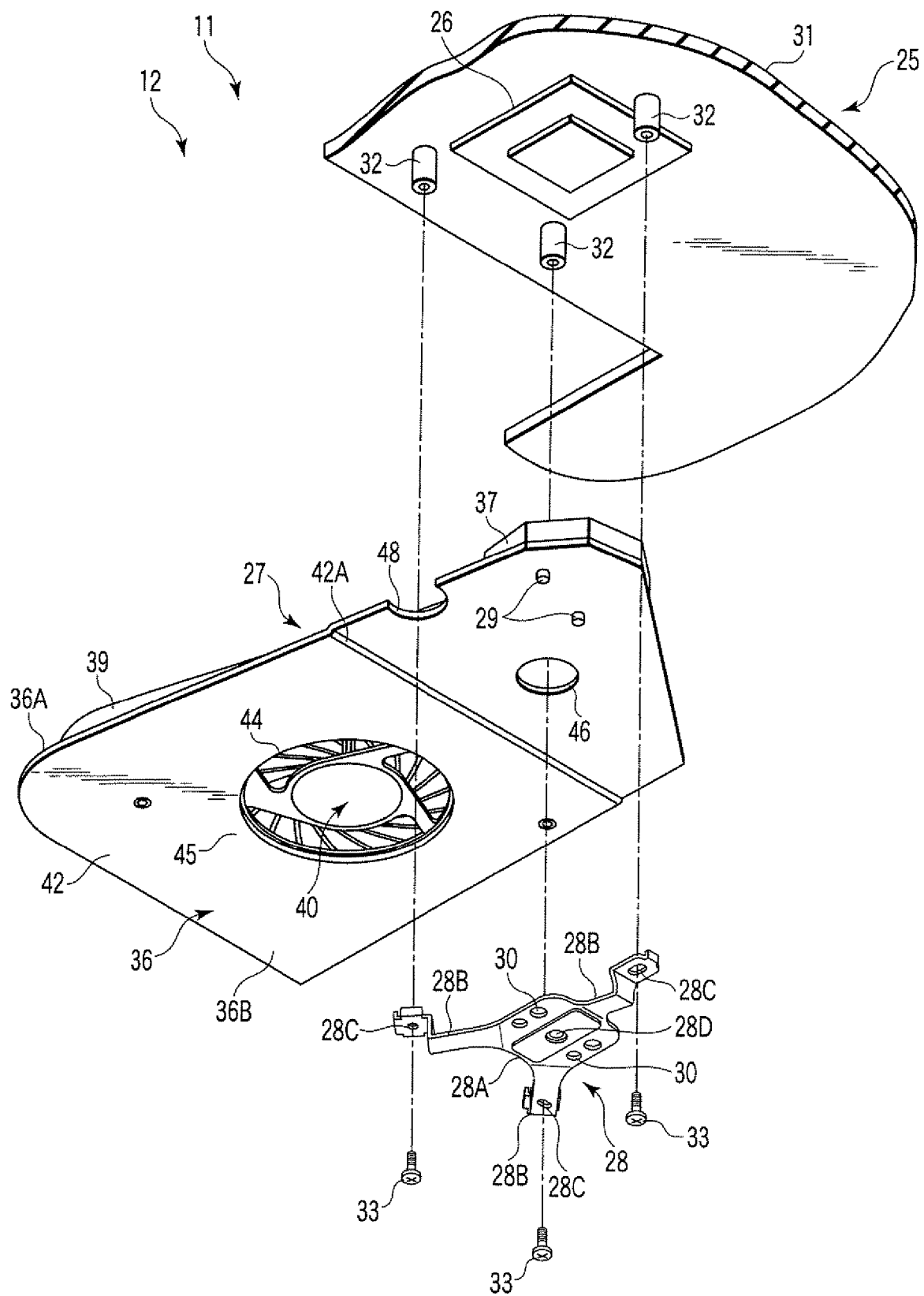
FIG. 4 is an exemplary exploded perspective view showing the cooling device and the print circuit board illustrated in FIG. 3.

As shown in FIGS. 3 and 4, the connecting mechanism 28 is made of, for example, a flexible metal plate. The connecting mechanism 28 includes a pressure portion 28A having substantially a square shape, and a total of three arm portions 28B extending respectively in three directions from the pressure portion 28A. A screw hole 28C is made in a distal end portion of each of the arm portions 28B. In order to fix the connecting mechanism to the first stud 32 of the printed circuit board 25, a screw 33 is put through each screw hole 28C. A semispherical projecting portion 28D is made at a central portion of the pressure portion 28A. With this projecting portion 28D, it is possible to assure enough pressure applied onto the electronic part 26 from the cooling device 27. The pressure portion 28A has holes 30 through which pins 29 are put as will be described later in detail.

As shown in FIG. 4, in order to fixate the cooling device 27 and the printed circuit board 25 to each other, the arm portions 28B of the connecting mechanism 28 are fixed to the first studs 32 of the printed circuit board 25 with respective screws 33, respectively, while interposing the cooling device 27 between the connecting mechanism 28 and the printed circuit board 25. In this manner, the cooling device 27 can be pressed against the electronic part 26 of the printed circuit board 25 at the projecting portion 28D of the pressure portion 28A.

Figure 5:
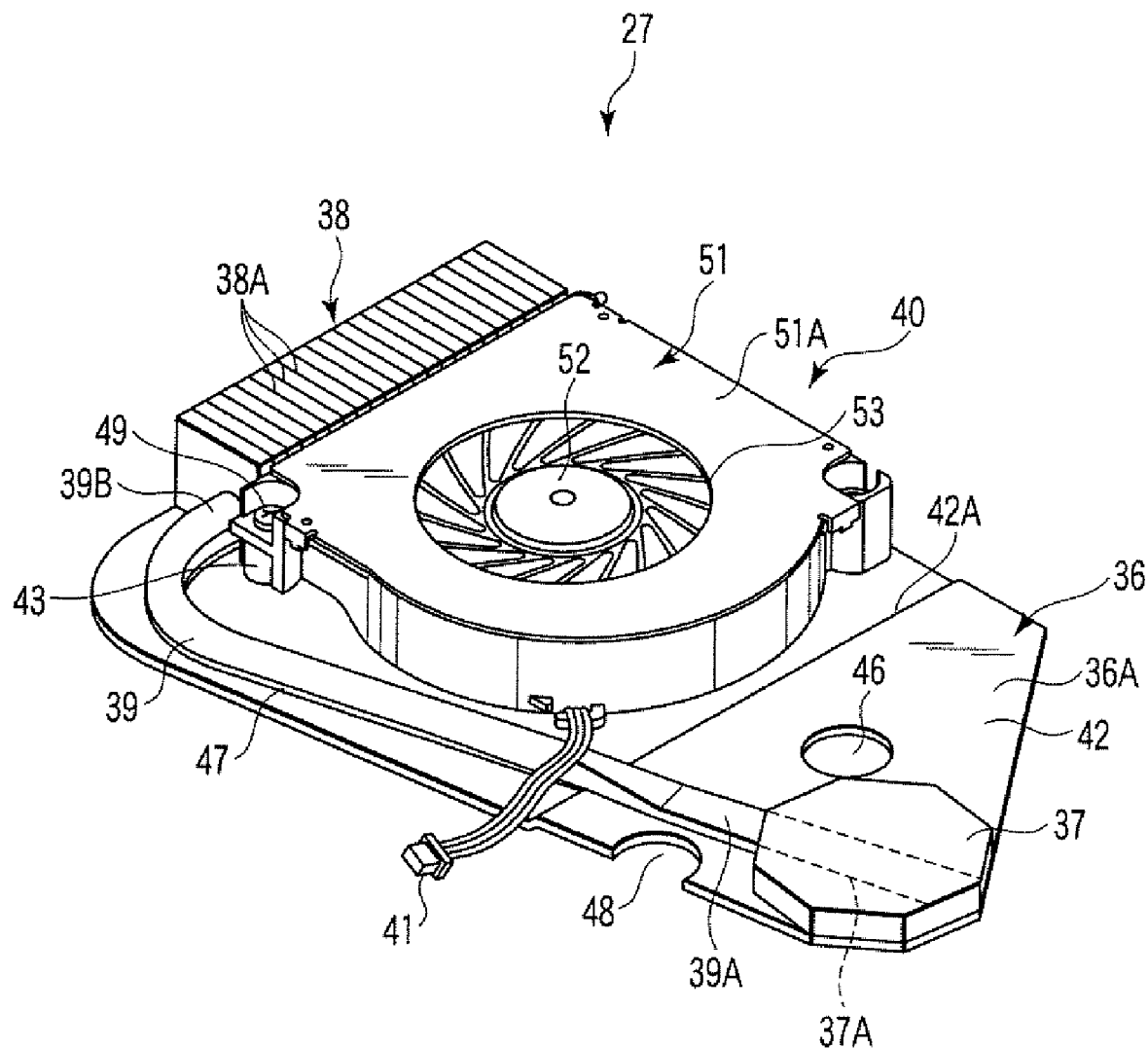
FIG. 5 is an exemplary perspective view showing the cooling device illustrated in FIG. 3.
Figure 6:
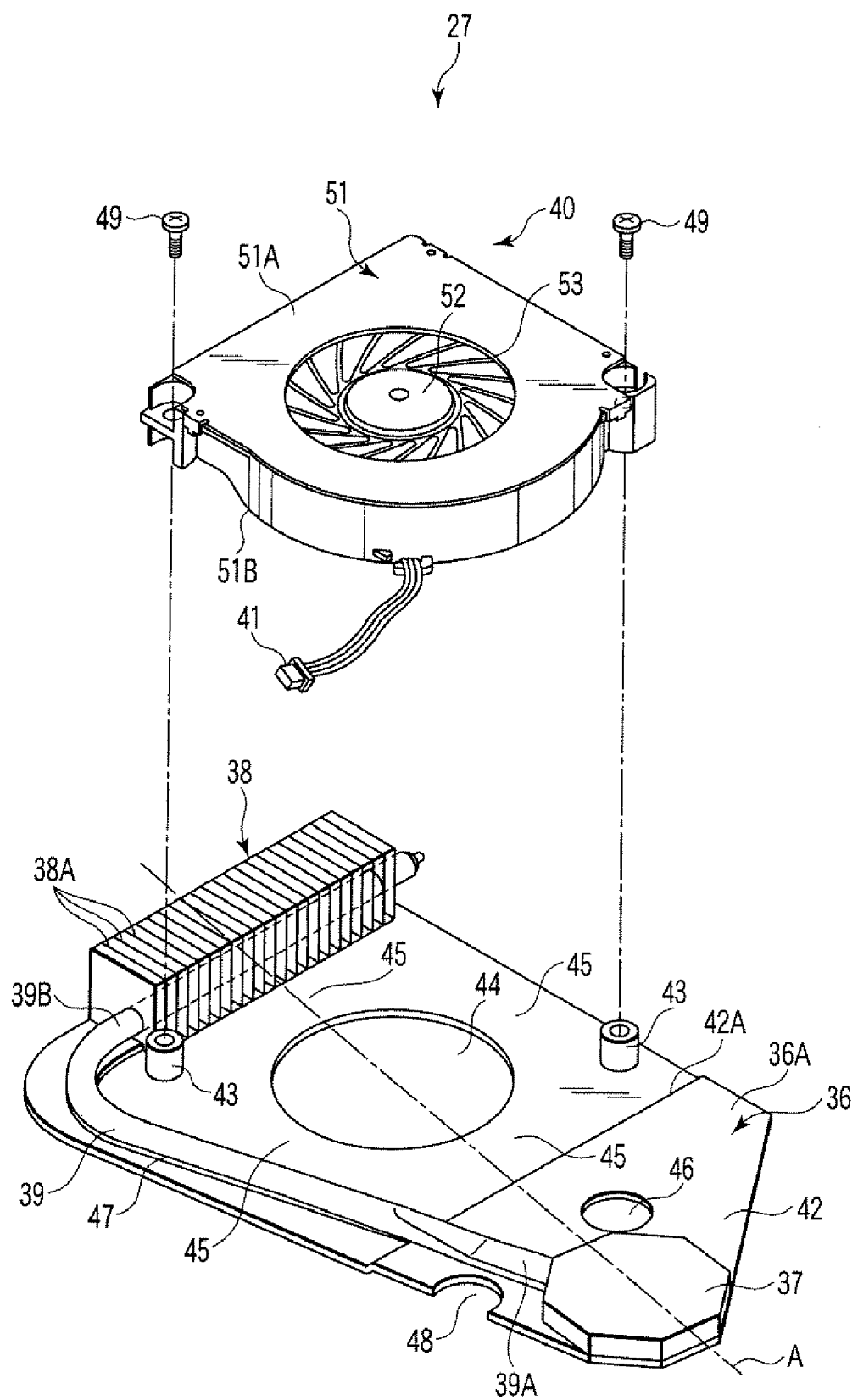
FIG. 6 is an exemplary exploded perspective view showing the cooling device illustrated in FIG. 5.

As shown in FIGS. 5 and 6, the cooling device 27 includes a heat diffusing plate 36, a heat receiving portion 37, a heat sink 38, a heat pipe 39 and a fan unit 40. The heat diffusing plate 36 is made of a copper-made plate. The heat diffusing plate 36 has a flat shape except for a step portion 42A, which will be later explained, that is, it has substantially a flat plate shape. The heat diffusing plate 36 has a first surface 36A and a second surface 36B located on an opposite side to the first surface 36A. To the first surface 36A of the heat diffusing plate 36, the heat receiving portion 37, the heat sink 38 and the heat pipe 39 are adhered by brazing. Further, the fan unit 40 is fixed to the first surface 36A of the heat diffusing plate 36.

The heat diffusing plate 36 includes a main body 42, a second stud 43 provided to project from the main body 42, an air ventilation portion 44 for the fan unit 40, an edge portion 45 that defines the surrounding, that is, the entire circumference of the air ventilation portion 44, a small hole 46 and a notch 48 through which arm portions 28B of the connecting mechanism 28 are put. The main body 42 of the heat diffusing plate 36 has a thickness of, for example, 0.5 mm to 1 mm. Since the main body 42 of the heat diffusing plate 36 is formed of a metal plate, it can be made thinner as compared to those made by die casting. A pair of pins 29 used to align the connecting mechanism 28 are provided on the second surface 36B of the heat diffusing plate 36.

The air ventilation portion 44 is an opening to supply air to the fan unit 40. The main body 42 includes the step portion 42A as described above. The step portion 42A is formed to have a height of several millimeters at a central portion of the main body 42. The step portion 42A serves to pull the installation position of the heat sink 38 slightly down to prevent the heat sink 38 from projecting upwards. The air ventilation section 44 and the step portion 42A are formed both by press working.

The second stud 43 is fixed to the main body 42 by, for example, caulking. The fan unit 40 is mounted to the heat diffusing plate 36 via the second stud 43. As shown in FIG. 6, the fan unit 40 and the air ventilation portion 44 are arranged on positions on straight line A drawn between the heat receiving portion 37 and the heat sink 38.

As shown in FIGS. 5 and 6, the heat diffusing plate 36 further as a slope portion 47. The slope portion 47 has such a shape that the height increases gradually from the vicinity of the heat receiving portion 37 towards the vicinity of the heat sink 38. The slope portion 47 is made of copper and it is adhered to the main body by, for example, brazing. The slope portion 47 and the heat pipe 39 are adhered to each other by, for example, brazing. The heat pipe 39 runs from the heat receiving portion 37 to the central portion of the heat sink 38 while maintaining the thermal connection to the main body 42 via the slope portion 47.

Figure 8:
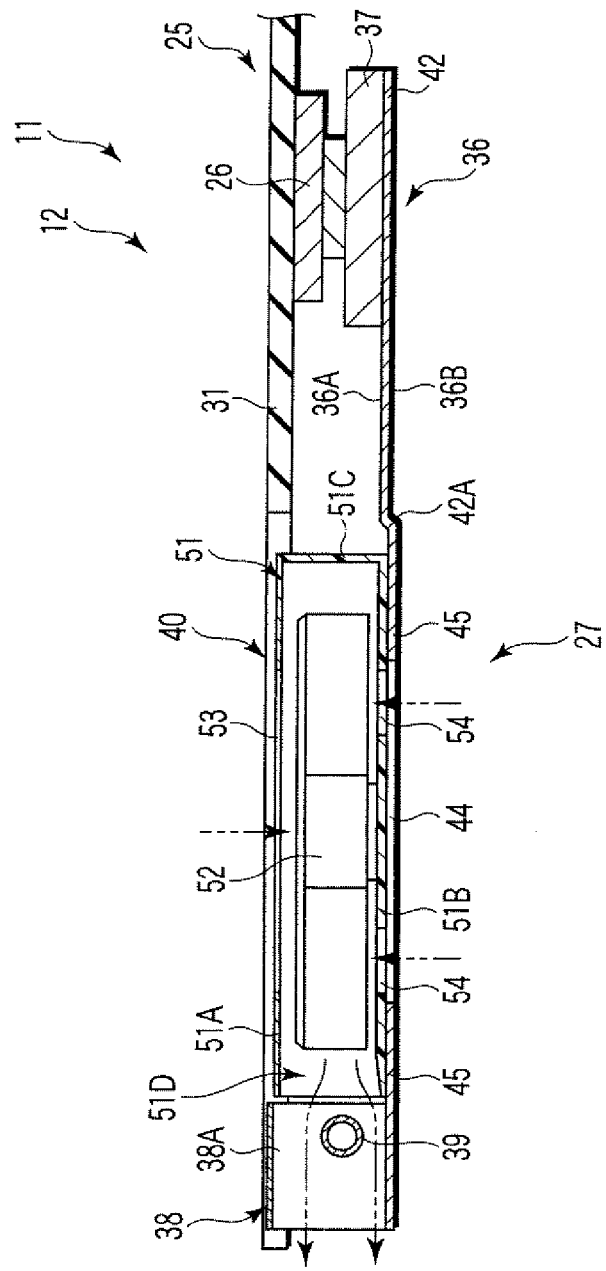
FIG. 8 is an exemplary cross sectional view of the cooling device illustrated in FIG. 2 taken along showing the line F8-F8.

The heat receiving portion 37 is adhered onto the heat diffusing plate 36 by, for example, brazing. The heat receiving portion 37 is formed of copper into a shape of an octagonal thick plate. The heat receiving portion 37 has a through hole 37A made within its wall thickness, through which the heat pipe 39 is put. As shown in FIGS. 3 and 8, the heat receiving portion 37 can be thermally connected to the electronic part 26 of the printed circuit board 25, which is an object to be cooled. Between the heat receiving portion 37 and the electronic part 26, for example, a thermal conductive grease is provided though it is not shown in the figure.

The heat pipe 39 is mounted on the heat diffusing plate 36 and adhered thereto by brazing. The heat pipe 39 has such a structure in which a liquid is sealed inside a copper-made cylindrical pipe. The heat pipe 39 has a first end portion 39A to be connected to the heat receiving portion 37 and a second end portion 39B to be connected to the heat sink 38. The second end portion 39B is located on an opposite side to the first end portion 39A. The heat pipe 39 is bent in the middle substantially at right angles. The heat pipe 39 connects the heat receiving portion 37 and the heat sink 38 to each other while detouring around the fan unit 40 and the air ventilating unit 44.

The heat sink 38 is mounted on the heat diffusing plate 36 and adhered thereto by brazing. The heat sink 38 has a plurality of fins 38A made of copper and having a square plate shape. The heat sink 38 is connected to the second end portion 39B of the heat pipe 39. The heat sink 38 can release the heat of the heat receiving portion 37 that is transmitted via the heat pipe 39 to the outside.

Figure 9:
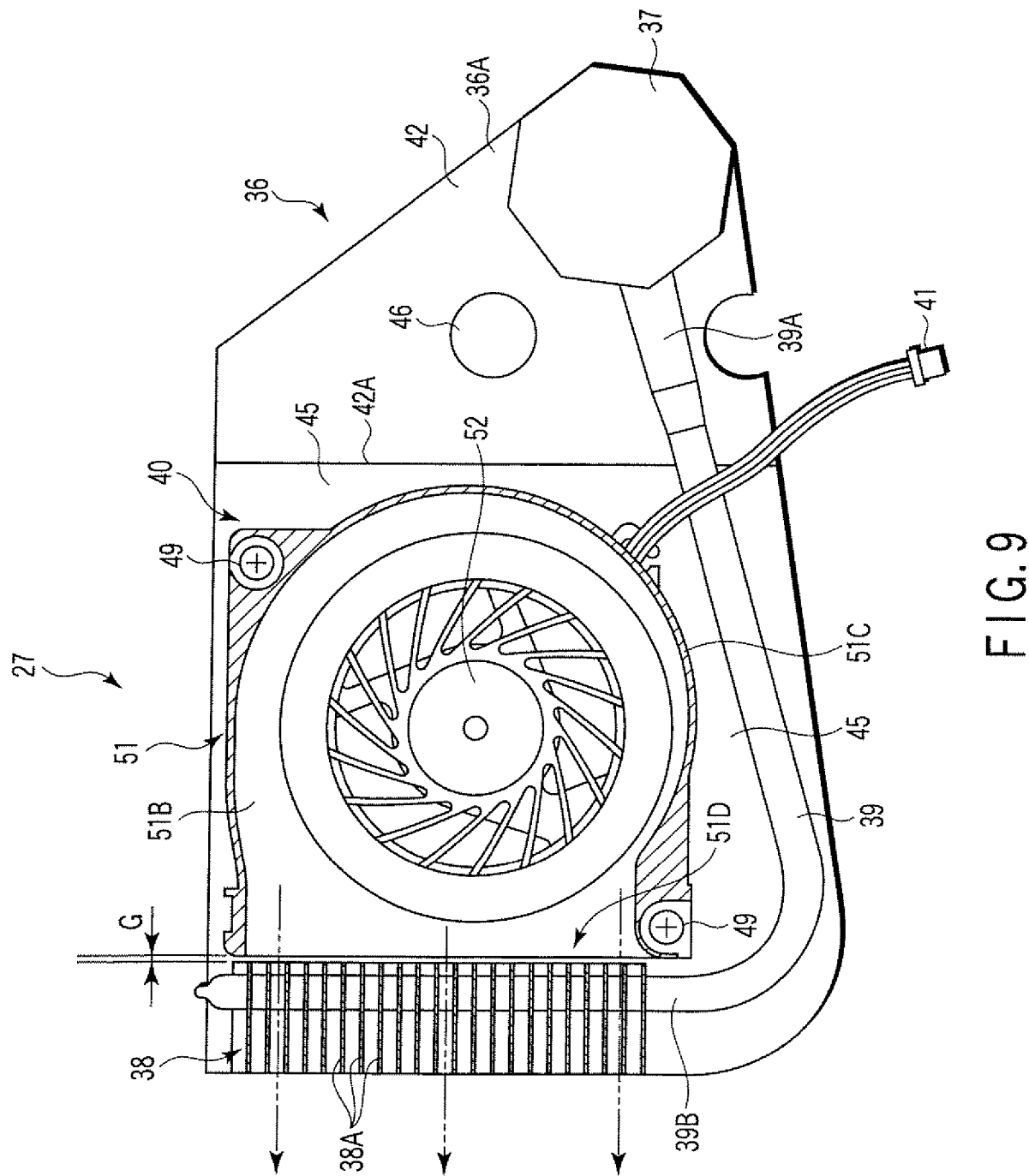
FIG. 9 is an exemplary cross sectional view of the cooling device illustrated in FIG. 7 taken along showing the line F9-F9.

The fan unit 40 is fixed to the second stud 43 on the heat diffusing plate 36 via a fixing screw 49. The fan unit 40 is placed on the heat diffusing plate 36 but away from the heat receiving portion 37, the heat sink 38 or the heat pipe 39. As shown in FIGS. 6, 8 and 9, the fan unit 40 includes a cover 51, a fan main body 52 housed inside the cover 51, a motor that rotates the fan main body 52, a connector 41 that supplies power to the motor, and an air outlet 51D opened towards the heat sink 38. The cover 51 has an upper wall 51A, a lower wall 51B and a side wall 51C. The upper wall 51A of the cover 51 has a first air intake opening 53. The lower wall 51B of the cover 51 has a second air intake opening 54. As shown in FIG. 9, the fan unit 40 is mounted on the heat diffusing plate 36 just close to the heat sink 38. Thus, a gap G between the heat sink 38 and the fan unit 40 is set as small as possible. The size of the gap G is, for example, about 0.1 to 1 mm.

Figure 7:
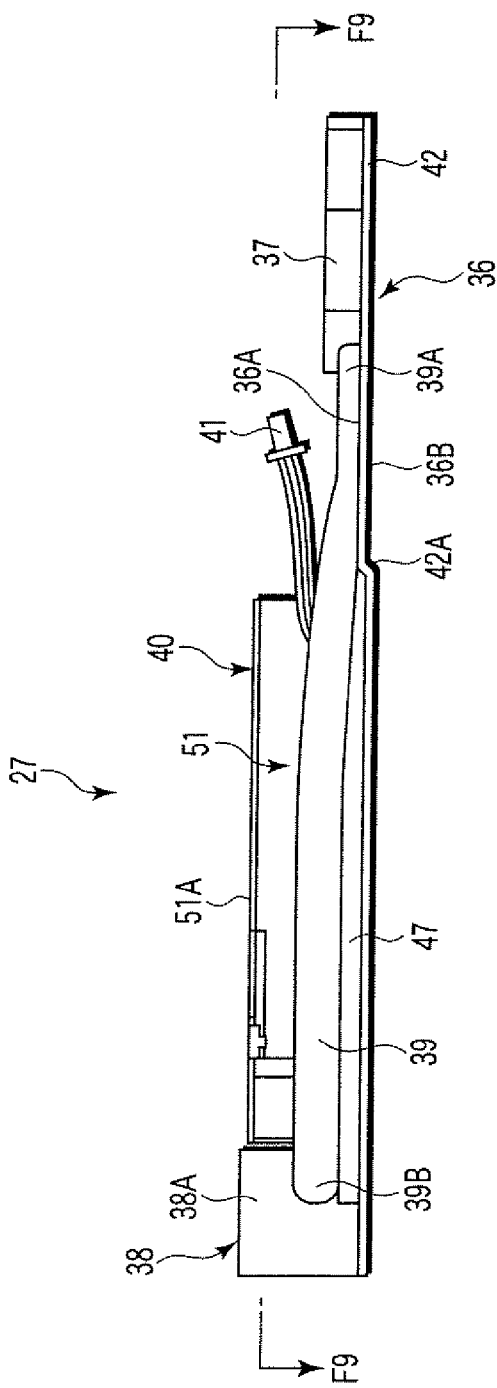
FIG. 7 is an exemplary front view showing the cooling device illustrated in FIG. 5.

As shown in FIG. 7, the heat receiving portion 37 of the cooling device 27, the heat pipe 39 and the fan unit 40 are arranged within the height of the heat sink 38. With this arrangement, the cooling device 27 has a flat thin shape as a whole.

The cooling effect of the cooling device 27 for the electronic part 26 will now be described with reference to FIGS. 8 and 9. In the cooling device 27 of this embodiment, heat generated from the electronic part 26 mounted on the printed circuit board 25 is transmitted to the heat receiving portion 37. The most of the heat that the heat receiving portion 37 receives is propagated via the heat pipe 39 to the heat sink 38. As the fan main body 52 is rotated by the driving operation of the motor, the fan unit 40 suctions air through the first air intake opening 53 and the second air intake opening 54 and feeds the air to the heat sink 38 via the air outlet 51D. The air absorbs the heat of the heat sink 38 and then the heat-absorbed air is discharged to the outside of the housing 21 via the air outlet 21B.

On the other hand, part of the heat received by the heat receiving portion 37 is propagated to the heat diffusing plate 36. The heat diffusing plate 36 propagates the heat transmitted from the heat receiving portion 37 via the main body 42, to the heat sink 38. At that time, the heat of the edge portion 45 of the heat diffusing plate 36 is being absorbed at all times by the air suctioned with the fan unit 40. Thus, during the heat transmission through the route of the heat diffusing plate 36, some portion of the heat being transmitted is released to the atmosphere with the air suctioned by the fan unit 40.

It should be noted that in this embodiment, all of the heat receiving portion 37, the heat sink 38, the heat pipe 39 and the heat diffusing plate 36 are made of copper, but alternatively they may be formed of a relatively high-conductive aluminum alloy. Further, all of the heat receiving portion 37, the heat sink 38 and the heat pipe 39 are adhered by brazing to the heat diffusing plate 36, but alternatively they may be adhered to the heat diffusing plate 36 by, for example, caulking. Further, in this embodiment, the heat receiving portion 37 is provided on the heat diffusing plate 36, but it is alternatively possible that the heat diffusing plate 36 and the object to be cooled are directly thermally connected to each other, to use the heat diffusing plate 36 also as the heat receiving portion 37 as well.

The first embodiment of the electronic device is as described above. According to this embodiment, the heat diffusing plate 36 is provided in addition to the heat pipe 39 in order to thermally connect the heat receiving portion 37 and the heat sink 38 together. With this structure, the heat diffusing plate 36 can assist the heat pipe 39 in terms of heat transmission function, and therefore the performance of the cooling device 27 can be improved. Further, the heat pipe 39 is connected to the heat receiving portion 37 by the first end portion 39A, and to the heat sink 38 by the second end portion 39B. Thus, the heat receiving portion 37 and the heat sink 38 are thermally connected together by both ends of the heat pipe 39, and therefore the most of the heat generated from the electronic part 26 can be propagated to the heat sink 38. In this manner, it is possible to prevent the heat from being released to other sections within the housing 21.

The heat transport by the heat pipe 39 depends on the transfer of vapor inside the pipe, and it is known that the heat pipe 39 has an angle dependency. More specifically, if the heat pipe 39 is arranged to extend in a vertical direction, the transfer of the vapor inside the pipe is blocked, thereby degrading the heat transport. Here, according to this embodiment, the heat diffusing plate 36 functions as a complement to the case where the efficiency of the heat pipe 39 is blocked due to the angle dependency, and thus extreme degradation of the performance for cooling of the electronic part 26 can be eased.

The heat diffusing plate 36 has substantially a flat shape. With this configuration, the bending to be carried onto the metal plate can be lessened to a minimum degree, and the heat diffusing plate 36 can be formed into a simple structure. Further, when the heat diffusing plate 36 is formed into a flat shape, the heat receiving portion 37, the heat sink 38 and the heat pipe 39 mounted on the heat diffusing plate 36 are arranged on one plane. Thus, the increase in thickness of the cooling device 27 can be prevented.

The cooling device 27 includes the fan unit 40 that promote the cooling of the heat sink 38, and the fan unit 40 is placed on the heat diffusing plate 36 at a position away from the heat receiving portion 37, the heat sink 38 or the heat pipe 39. With this configuration, the fan unit 40 is arranged not to lay on some other structure on the heat diffusing plate 36, and thus the cooling device 27 can be made thin.

In usual cases, a fan unit 40 is mounted on a housing 21 and a clearance is created between the fan unit 40 fixed to the housing 21 and the heat sink 38 of the cooling device 27 in the light of the tolerance and mounting error of each member. However, according to this embodiment, the fan unit 40 is mounted on the heat diffusing plate 36, and therefore, the tolerance of each of only such parts as the fan unit 40, the heat sink 38 and the second stud 43 should be taken into consideration. Therefore, the gap G between the heat sink 38 and the fan unit 40 can be set to a minimum level. With this configuration, the fan unit 40 can be set at a position immediately close to the heat sink 38 on the heat diffusing plate 36. Thus, the leakage of the air flow from the fan unit 40 into the housing 21 through the gap G, which releases the heat inside the housing 21, can be prevented.

The heat receiving portion 37, the heat sink 38, the heat pipe 39 and the fan unit 40 are all provided on the first surface 36A of the heat diffusing plate 36. With this configuration, these structural members do not project from either one of the first and second surfaces 36A and 36B of the heat diffusing plate 36. Thus, the increase in thickness of the cooling device 27 can be prevented.

The heat receiving portion 37, the heat pipe 39 and the fan unit 40 are arranged within a range of the height of the heat sink 38. With this configuration, the heat receiving portion 37, the heat pipe 39 and the fan unit 40 mounted on the heat diffusing plate 36 do not go beyond the range of the height of the heat sink 38. That is, they do not project further from the top of the heat sink 38. Therefore, the cooling device 27 can be made flat and thin.

The heat diffusing plate 36 includes the air ventilation portion 44 that feeds air to the fan unit 40 and the edge portion 45 that defines the circumference of the air ventilation portion 44. With this structure, the suctioned air fed to the fan unit 40 passes through the air ventilation portion 44, and during this, the air colds down the edge portion 45 around the air ventilation portion 44. Therefore, a further heat radiating property can be imparted to this heat-conductive heat diffusing plate 36. In this manner, the performance of the cooling device 27 can be improved. At the same time, the heat radiating performance of the cooling device 27 as a whole is improved, and therefore the size of the heat sink 38 can be reduced. With the reduction in size of the heat sink 38, the cooling device 27 can be further thinned.

The fan unit 40 and the air ventilation portion 44 are arranged on positions on a straight line drawn between the heat receiving portion 37 and the heat sink 38. With this structure, the heat of the heat receiving portion 37 is transmitted to the heat sink 38 via the edge portion 45 located to surround the air ventilation portion 44 while detouring around the ventilation portion 44. While the heat being transmitted, the air passing through the air ventilation portion 44 towards the fan unit 40 absorbs part of the heat of the edge portion 45. This mechanism becomes more effective when the air ventilation portion 44 is placed at a position on the straight line connecting the heat receiving portion 37 and the heat sink 38 as in this embodiment, since with the structure of the embodiment, the area of the edge portion 45, which serves as a heat radiating portion, can be increased. Further, the section that connects the heat receiving portion 37 and the heat sink 38 together at the minimum distance can release the heat to the atmosphere. In this manner, the heat radiating property of the cooling device 27 can be even more improved.

The heat pipe 39 connects the heat receiving portion 37 and the heat sink 38 together while detouring around the fan unit 40 and the air ventilation portion 44. With this structure, heat is transported over a long distance along the heat pipe 39 having a high transport performance, whereas in the heat diffusing plate 36 having a heat transport performance lower than that of the heat pipe 39, heat can be transported over a short distance. With this arrangement, the heat can be transported efficiently without stagnation of heat in the middle.

The heat receiving portion 37, the heat sink 38, the heat pipe 39 and the heat diffusing plate 36 are all made of copper. When these structural members are made of a high heat-conductive copper, the performance of the cooling device 27 can be further improved.

Figure 10:
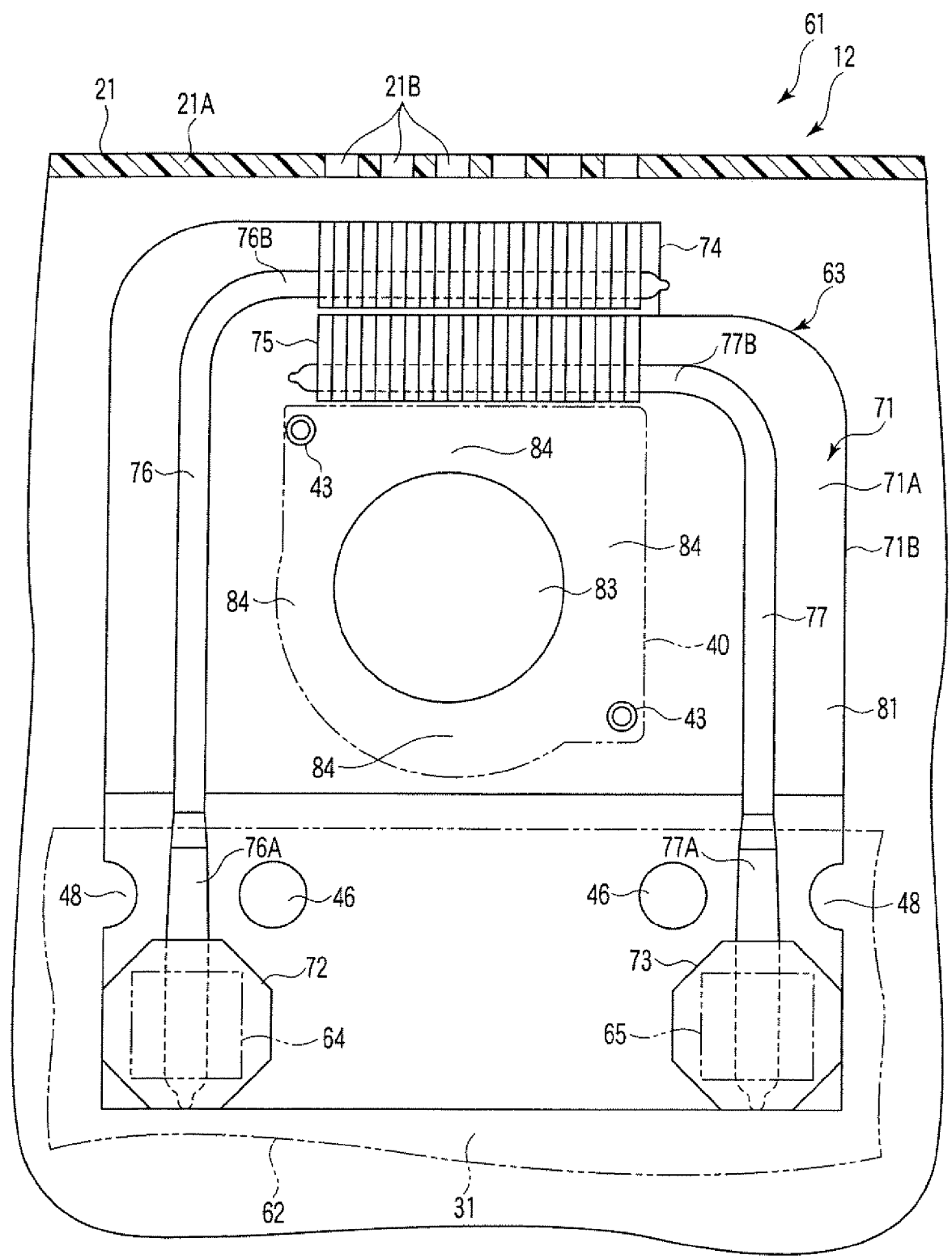
FIG. 10 is an exemplary top view showing a cooling device of a portable computer according to a second embodiment.

Next, an electronic device according to the second embodiment will now be described with reference to FIG. 10. A portable computer 61, which is an example of the electronic device of the second embodiment, is different from that of the first embodiment in the structure of a cooling device 63. The rest of the structure is common to both of the first and second embodiments. Therefore, the explanation will be made mainly for the different part. The common structural elements will be designated by the same reference numerals, and the explanations therefore will not be repeated.

The portable computer 61 includes a main body unit 12 and a display unit. The main body unit 12 further includes a housing 21, a printed circuit board 62 housed inside the housing 21, a cooling device 63 and a pair of connecting mechanisms that connects the housing 21 and the cooling device 63 together. The printed circuit board 62 includes a printed wiring board 31 in which copper-made wiring layers are stacked one another, a first electronic part 64 and a second electronic part 65 mounted on the printed wiring board 31. The first electronic part 64 is an example of the object to be cooled, and it is, for example, a CPU. The second electronic part 65 is an example of the object to be cooled, and it is, for example, a graphics chip. As a matter of course, the first and second electronic parts 64 and 65 are not limited to these examples, but they may be north bridges and the like. Although each of the connecting mechanisms is not shown in the figure, they have a similar shape to that of the first embodiment.

The cooling device 63 includes a heat diffusing plate 71, a first heat receiving portion 72, a second heat receiving portion 73, a first heat sink 74, a second heat sink 75, a first heat pipe 76, a second heat pipe 77 and a fan unit 40. The heat diffusing plate 71 is made of a copper-made plate. The first heat receiving portion 72 corresponds to the first electronic part 64 and the second heat receiving portion 73 corresponds to the second electronic part 65. The first heat receiving portion 72 and the second heat receiving portion 73 are made of thick copper plates. Each of the first and second heat pipes 76 and 77 has such a structure in which a liquid is sealed inside a copper-made cylindrical pipe. The first heat pipe 76 has a first end portion 76A to be connected to the first heat receiving portion 72 and a second end portion 76B to be connected to the first heat sink 74. The second heat pipe 77 has a first end portion 77A to be connected to the second heat receiving portion 73 and a second end portion 77B to be connected to the second heat sink 75. The first and second heat receiving portions 72 and 73, the first and second heat sinks 74 and 75 and the first and second heat pipes 76 and 77 are each adhered to the heat diffusing plate 71 by brazing.

The heat diffusing plate 71 has the first surface 71A and the second surface 71B. The first heat receiving portion 72, the second heat receiving portion 73, the first heat sink 74, the second heat sink 75, the first heat pipe 76, the second heat pipe 77 and the fan unit 40 are provided on the first surface 71A. The heat diffusing plate 71 includes a main body 81, a second stud 43, an air ventilation portion 83, an edge portion 84 and a slope portion. The second stud 43 is fixed to the main body 81 by, for example, caulking. The fan unit 40 is mounted to the heat diffusing plate 71 via the second stud 43. The slope portion is brazed to, for example, the main body 81.

Next, the cooling operation of the portable computer 61 according to the second embodiment will now be described. In the second embodiment, the heat generated from the first electronic part 64 is absorbed by the first heat receiving portion 72, and the heat of the second electronic part 65 by the and second heat receiving portion 73. The most of the heat absorbed by the first heat receiving portion 72 is transmitted to the first heat sink 74 via the first heat pipe 76, and the same of the second heat receiving portion 73 to the second heat sink 75 via the second heat pipe 77. The heat of each of the first and second heat sinks 74 and 75 is released to the outside of the housing 21 by the air blow fed from the fan unit 40. On the other hand, part of the heat absorbed by each of the first and second heat receiving portions 72 and 73 is transmitted to the heat diffusion plate 71. The heat diffusing plate 71 propagates part of the transmitted heat to each of the first and second heat sinks 74 and 75. Further, when air is being suctioned by the fan unit 40, part of the heat of the edge portion 84 is absorbed by the air passing through the air ventilation portion 83. In this manner, the heat diffusing plate 71 also can exhibit the heat radiating effect.

According to the second embodiment, when both of the first electronic part 64 and the second electronic part 65 need to be cooled down, these members can be each cooled at a high efficiency. Here, the heat diffusing plate 71 that serves to cool the first electronic part 64 and the second electronic part 65 is made of a single plate. Therefore, as compared to the case where two independent cooling devices are provided, this embodiment can achieve the reduction in size of the installation space.

The cooling devices 27 and 63 and the electronic devices of the present invention can be applied not only to portable computers, but also some other types of electronic devices such as portable information terminals. Further, the cooling devices 27 and 63 and the electronic devices can be modified into various versions as long as the essence of the invention remains within its scope.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising: a housing; a cooling device in the housing; and a printed circuit board in the housing and comprising a heat generating part, a first surface facing the cooling device, a second surface on an opposite side to the first surface, and an opening portion, wherein the cooling device further comprising: a heat diffusion plate comprising a third surface facing the printed circuit board, a heat receiving portion on the heat diffusion plate and thermally connected to the heat generating part, a heat sink on the heat diffusion plate, that releases, heat from the heat receiving portion to outside, a heat pipe comprising a first end portion to be connected to the heat receiving portion and a second end portion on an opposite side to the first end portion and to be connected to the heat sink, and a fan unit that promotes heat radiation of the heat sink on the heat diffusion plate, the fan unit being arranged within a height defined by the second surface and the third surface and a part of the fan unit is in the interior of the opening portion.

2. The electronic device according to claim 1, further comprising a connecting mechanism in the housing, which fixes the cooling device to a stud, wherein the printed circuit board comprises the stud for installing the cooling device, the heat diffusion plate comprises a step portion which is bent to form a recess; the cooling device is arranged between the printed circuit board and the connecting mechanism, and the connecting mechanism is opposed to the heat diffusion plate in the recess.

* * * * *